(12) United States Patent
Higashitani

(10) Patent No.: US 8,071,881 B2
(45) Date of Patent: Dec. 6, 2011

(54) WIRING BOARD, METHOD FOR MANUFACTURING SAME AND SEMICONDUCTOR DEVICE

(75) Inventor: Hideki Higashitani, Kyoto (JP)

(73) Assignee: Panasonic Corporation, Osaka (JP)

( * ) Notice: Subject to any disclaimer, the term of this patent is extended or adjusted under 35 U.S.C. 154(b) by 1239 days.

(21) Appl. No.: 11/719,313

(22) PCT Filed: Nov. 17, 2005

(86) PCT No.: PCT/JP2005/021115
§ 371 (c)(1),
(2), (4) Date: May 15, 2007

(87) PCT Pub. No.: WO2006/054637
PCT Pub. Date: May 26, 2006

(65) Prior Publication Data
US 2009/0133915 A1      May 28, 2009

(30) Foreign Application Priority Data
Nov. 18, 2004   (JP) .................................. 2004-334125

(51) Int. Cl.
*H05K 1/00* (2006.01)
(52) U.S. Cl. .................... 174/250; 174/255; 361/792
(58) Field of Classification Search .................. 174/250, 174/261–266; 361/792–795
See application file for complete search history.

(56) References Cited

FOREIGN PATENT DOCUMENTS

| JP | 3-239528 | 10/1991 |
|---|---|---|
| JP | 9-172104 | 6/1997 |
| JP | 11-176886 | 7/1999 |
| JP | 2002-076530 | 3/2002 |
| JP | 2002-100696 | 4/2002 |
| JP | 2003-031926 | 1/2003 |
| JP | 2003-236982 | 8/2003 |

OTHER PUBLICATIONS

Machine Translation of JP 2002-076530 (Mar. 15, 2002).*
Machine translation of JP 09-172104 (Jun. 30, 1997).*
International Search Report (PCT/JP2005/021115) dated Feb. 28, 2006.

* cited by examiner

*Primary Examiner* — Jeremy Norris
(74) *Attorney, Agent, or Firm* — Pearne & Gordon LLP

(57) ABSTRACT

A wiring board which includes a product portion configured with at least one layer of electrically insulating base, a wiring pattern formed on the surface or inner portion of the electrically insulating base, and a wiring protection layer which is formed on the surface of the board and has an opening. Warping over the entire wiring board can be reduced since this wiring board has a warp-correcting portion warped in a direction different from that of the product portion.

15 Claims, 5 Drawing Sheets

PRIOR ART

US 8,071,881 B2

WIRING BOARD, METHOD FOR MANUFACTURING SAME AND SEMICONDUCTOR DEVICE

TECHNICAL FIELD

The present invention relates to thin resin wiring boards, including rigid boards and flexible boards, and more particularly to wiring boards featuring curable solder resist and their manufacturing methods.

BACKGROUND ART

The density of components mounted on wiring boards is rapidly increasing in response to the further downsizing and advancement of electronic apparatuses. For mobile devices, in particular, there are growing demands for electronic components mounted on thinner wiring boards to occupy a lower profile.

In response to these demands, a thinner electrically insulating base has been developed for the wiring boards used in these types of electronic apparatuses. For example, thinner boards but with the same number of layers are now feasible. A four-layer rigid board of 0.25 mm or thinner and multilayer flexible board about 0.1 mm thick have been put into practical use. For applications which conventionally require six to eight layers in multilayer boards, wiring is housed in fewer layers by the use of high-density wiring boards such as build-up wiring boards. As a result, demands for thinning wiring boards are increasing.

Since the rigidity of these thin boards is lower, the wiring boards are prone to warping. Drying, curing shrinkage, material properties, and rigidity of solder resist formed on the surface of wiring board as a wiring protection layer significantly affect the degree of warping of the wiring board.

Methods of correcting the warping of wiring boards are disclosed in Japanese Patent Unexamined Publication No. H08-45984, Japanese Patent Unexamined Publication No. 2002-83843, and Japanese Patent Unexamined Publication No. 2002-324824, with respect to a tape carrier for TAB (tape automated bonding). In these prior arts, warping is corrected by drying and curing the solder resist under conditions where the wiring board is curved when the solder resist is formed on a film base.

However, in the manufacturing process of wiring boards for board sizes of about 300 mm to 500 mm, curvature cannot be accurately controlled, resulting in difficulty in applying the conventional methods.

A conventional wiring board is described next with reference to FIGS. 6A to 6E.

FIG. 6A is a plan view illustrating the surface of a wiring board sheet. Multiple product portions 1 are provided on the wiring board. Here, the product portion is a unit product area on which an electronic component is mounted to gain a circuit function. It is the portion which will be built into an electronic apparatus.

In general, in addition to product portions 1 on the wiring board, solder resist is formed continuously on the surface and rear face of product portions 1 as a wiring protection layer. A wiring pattern and a solder resist pattern on each product portion 1 are determined based on the product's specifications. Accordingly, the stress in the thickness direction is not balanced locally, and this causes slight warping.

When product portions 1, which contain this slight warping respectively, are provided on the wiring board sheet, each slight warping accumulates, resulting in generating a large warping on a large sheet.

FIG. 6B is a sectional view illustrating warping, taken along line A-A' in FIG. 6A. In this case, as an example, product portion 1 is warped in a convex manner on the surface.

FIG. 6C is a magnified view of part B in FIG. 6A where product portions 1 are continuously provided. FIG. 6E is a rear view of FIG. 6C. Here, an opening is created in wiring protection layer 2 on the surface of product portion 1, and electronic component connection pad 3 and wiring pattern 5 are exposed from this opening. On the rear face, connection pads 4 aligned in a grid are exposed from wiring protection layer 2.

In this type of thin board, warping occurs to an even more severe extent on product portion 1 due to the difference in opening patterns in wiring protection layers 2 on the surface and rear face. Warping accumulates as a result of continuously disposing product portions 1, as shown in FIG. 6C. FIG. 6D is a sectional view illustrating warping, taken along C-C' in FIG. 6C. In FIG. 6D, the height at both ends of the cross-section taken along C-C' in FIG. 6C is leveled for illustrating a schematic sectional view, and thus the drawing shows warping displacement as a conceptual figure, and not the accurate shape.

When electronic components are mounted on a wiring board, they are generally mounted on the wiring board sheet where multiple product portions 1 are provided, rather than mounting each component on independent product portion 1, so as to achieve high productivity in mounting electronic components. As a result, warping generated on the wiring board sheet has been causing failure in transport, low positional accuracy in mounting electronic components, and low mounting reliability in the electronic component mounting process.

SUMMARY OF THE INVENTION

A wiring board of the present invention includes a product portion configured with a wiring pattern and wiring protection layer formed on an electrically insulating base, and a warp-correcting portion provided on the periphery of or around the product portion. In this wiring board, the warp-correcting portion is warped in a direction different from the warping direction of the product portion. Since the warp-correcting portion is warped in a direction different from that of the product portion, warping on the entire wiring board can be reduced.

Still more, the wiring board of the present invention includes the product portion configured with the wiring pattern and wiring protection layer formed on the electrically insulating base, an area other than the product portion provided on the electrically insulating base, and the warp-correcting portion. The product portion includes a mounting area and an area not for mounting. In this wiring board, the warp-correcting portion may be provided on the area other than the product portion or the area not for mounting.

Furthermore, the present invention includes a step of forming the wiring board which includes the electrically insulating base and wiring pattern, a step of forming the wiring protection layer on the surface and rear face of the wiring board, and a step of correcting warping at a temperature not less than the glass transition temperature of the electrically insulating base and the wiring protection layer. Thermal treatment at the temperature not less than the glass transition temperature of the electrically insulating base and wiring protection layer reduces an internal stress of the electrically insulating base and wiring protection layer. This results in eliminating a residual stress applied during the production steps, enabling correction of warping of the wiring board.

The present invention suppresses warping of the entire wiring board even when the wiring board is thin and is prone to warping. Consequently, the present invention offers the wiring board which achieves good electronic component mountability, and it manufacturing method.

REFERENCE MARKS IN THE DRAWINGS

Figure 1A:
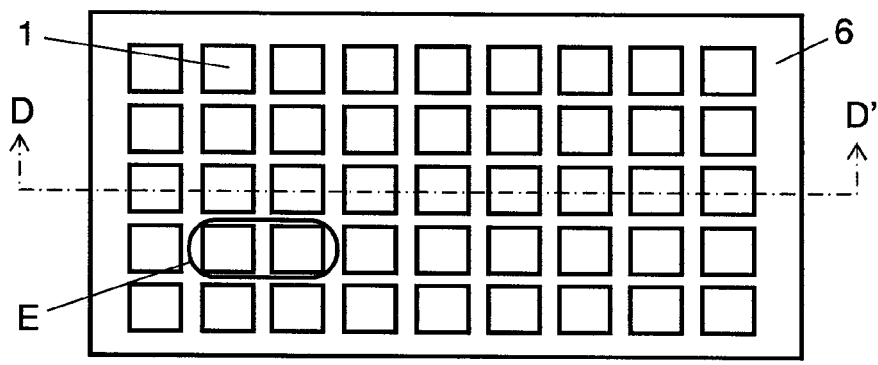
FIG. 1A is an appearance view of a wiring board in accordance with a first exemplary embodiment of the present invention.

1 Product portion
2 Wiring protection layer
3 Electronic component connection pad
4 Connection pad
5 Wiring pattern
6 Warp-correcting portion
7 Electrically insulating base
8 Wiring board
9 Flat board
10 Via
11 Semiconductor chip
12 Solder ball
13 Connecting portion
14 Sealing resin
15 Solder ball
16 Wiring protection layer

DETAILED DESCRIPTION OF PREFERRED EMBODIMENTS

A wiring board of the present invention includes a product portion configured with a wiring pattern and a wiring protection layer formed on an electrically insulating base, and a warp-correcting portion provided on a periphery of or around the product portion. The warp-correcting portion is warped in a direction different from a warping direction of the product portion. This enables reduction of warping over the entire wiring board. Warping of the wiring board here refers to that caused by factors such as drying, curing shrinkage, material properties, and rigidity of solder resist formed on the surface of the wiring board to act as a wiring protection layer.

In the wiring board of the present invention, connection pads formed with a wiring pattern and aligned in a grid, and the wiring protection layer which has openings to expose the connection pads are provided on one face of the product portion. The other face of the product portion may have a wiring protection layer whose opening area is larger than the total opening area for the connection pads. Provision of the warp-correcting portion of the present invention on an area other than the product portion effectively suppresses warping, even if connecting terminals for a motherboard are aligned in a grid on the rear face and the wiring protection layer is formed over the entire face.

In the wiring board of the present invention, connection pads formed with a wiring pattern and aligned in a grid, and the wiring protection layer which has openings to expose the connection pads are provided on one face of the product portion. The other face may not have a wiring protection layer. Provision of the warp-correcting portion of the present invention in an area other than the product portion effectively suppresses warping, even if there is a large opening in the wiring protection layer on a semiconductor mounting face for mounting a semiconductor chip, and the wiring protection layer is formed over the entire rear face because connecting terminals for motherboard are aligned in a grid on the rear face, which is the case of wiring boards for packages and modules such as a BGA (ball grid array) and CSP (chip size package).

In the wiring board of the present invention, multiple product portions are provided on the wiring board, and the warp-correcting portion may be provided between the product portions. Provision of the warp-correcting portion between the product portions suppresses accumulation of warping when the product portions are continuously disposed, reducing the warping over the entire sheet.

In the wiring board of the present invention, at least a part of the warp-correcting portion may be configured as a wiring protection layer on only one face of the wiring board. Provision of the wiring protection layer on only one side of the warp-correcting portion facilitates the formation of corrective warping using a narrower warp-correcting portion. Consequently, the product portions can be disposed at a high density, allowing an increased number of products per sheet.

In the wiring board of the present invention, the wiring pattern may not be formed on an inner layer and outer layer of the wiring board in at least a part of the warp-correcting portion. An elastic modulus of the warp-correcting portion can be reduced by avoiding the provision of the wiring pattern, which is made of a highly rigid metal foil, on the inner layer of the warp-correcting portion. This facilitates the formation of a corrective warping, achieving warping correction with an even further narrower width.

In the wiring board of the present invention, the thickness of the wiring protection layer may be different between the surface and rear face of the wiring board. A bending moment due to drying and curing shrinkage of the wiring protection layer of the warp-correcting portion can be increased by forming a thicker wiring protection layer to afford warping correction. This achieves warping correction with an even further narrower width.

In the wiring board of the present invention, the wiring protection layer is curable resin, and the curing rate of the curable resin may be different between the surface and rear faces. The bending moment due to drying and curing shrinkage of the wiring protection layer of the warp-correcting portion can be increased by setting a higher curing rate for the wiring protection layer to afford warping correction. This achieves warping correction with an even further narrower width.

In the wiring board of the present invention, the warp-correcting portion may be warped in a direction opposite to the warping direction of the product portion, using the electrically insulating base and wiring pattern. The warp-correcting portion can be warped in a required direction before forming the wiring protection layer by disposing the wiring pattern on the wiring board at the warp-correcting portion asymmetrically in the thickness direction. This assists warping correction by means of the wiring protection layer.

In the wiring board of the present invention, the electrically insulating base may be a composite material including glass fiber and thermosetting resin. The use of the warp-correcting portion of the present invention enables suppression of the warping of the wiring board sheet even if the wiring board is made of the composite material of glass fiber and thermosetting resin, that is highly rigid and less warped by its own weight.

In the wiring board of the present invention, the electrically insulating base may be a composite material including organic resin fiber and thermosetting resin. The use of organic resin fiber as a reinforcing material enables reduction of an elastic modulus of the electrically insulating base, even for a rigid wiring board. This achieves a warp-correcting portion with a narrower width, making even denser placement of product portions feasible.

In the wiring board of the present invention, the electrically insulating base may be a composite material including a heat-resisting film and adhesive. The use of the warp-correcting portion of the present invention effectively reduces warping, even for a flexible board whose rigidity is increased by laminating heat-resisting film bases using adhesive.

In the wiring board of the present invention, the elastic modulus of the electrically insulating base may be 10 GPa or less. The elastic modulus not greater than 10 Gpa for the electrically insulating base facilitates warping of the warp-correcting portion. This increases flexibility in design of the warp-correcting portion.

A semiconductor device of the present invention includes a semiconductor mounted on the product portion of the wiring board. A transport failure due to warping of the wiring board or deviation in mounting position of semiconductor can be reduced by mounting the semiconductor on the wiring board of the present invention, which suppresses warping over the entire sheet. This improves the production yield of semiconductor devices, and also improves primary mounting reliability of the semiconductor in the semiconductor device.

A manufacturing method of the wiring board of the present invention includes the step of forming the wiring board including the electrically insulating base and wiring pattern, the step of forming the wiring protection layer on the surface and rear face of the wiring board, and the step of heating at a temperature not less than the glass transition temperature of the electrically insulating base and wiring protection layer. Thermal treatment at the temperature not less than the glass transition temperature of the electrically insulating base and wiring protection layer reduces the internal stress of the electrically insulating base and wiring protection layer, and thus eliminates any residual stress applied during the manufacturing steps, enabling correction of warping of the wiring board.

In the manufacturing method of the wiring board of the present invention, the electrically insulating base and the wiring protection layer are configured with curable resin, and the curing rate of the electrically insulating base may be increased in the step of heating. The curing rate is increased by additionally curing the electrically insulating base in the warp-corrected state. This enables effective correction of mechanical bending or warping, applied during the manufacturing steps of the electrically insulating base which is more rigid than the wiring protection layer.

In the manufacturing method of the wiring board of the present invention, ultraviolet rays (UV rays) may be irradiated in the step of heating. Warping can be further effectively corrected by UV curing when a photosensitive material is used for the wiring protection layer and is patterned by photolithography.

In the manufacturing method of the wiring board of the present invention, UV rays may be irradiated on one face at a time of the wiring board. This allows the setting of a different curing rate of the photosensitive wiring protection layer on the surface, and rear face and facilitates the control of the warping degree of the warp-correction portion.

In the manufacturing method of the wiring board of the present invention, the wiring board may be sandwiched between flat boards in the step of heating. Warping and waving on a large sheet of wiring board can be easily eliminated by correcting warping of the wiring board by sandwiching the board between the flat boards.

In the manufacturing method of the wiring board of the present invention, the flat boards for sandwiching the wiring board may be made of a UV-ray transmitting material in the step of correcting warping. Since the flat boards transmit UV rays, the warp-correcting effect by UV curing can also be achieved in the step of correcting warping, further reducing warping.

Exemplary embodiments of the present invention are described next with reference to drawings. Components same as those described in the prior art may be given the same reference numerals.

First Exemplary Embodiment

FIG. 1A illustrates the surface of a wiring board sheet. Product portion 1 is provided on a surface (first face) of the wiring board. A rear face of the wiring board is called the second face. Warp-correcting portion 6 is formed on an area other than product portion 1 of the wiring board sheet. FIG. 1A illustrates an example of providing multiple product portions on the wiring board sheet, but the concept of the present invention is also applicable to the case when single product portion 1 is provided on the wiring board sheet. Warp-correcting portion 6 is warped in a direction different from a warping direction of product portion 1. This suppresses significant warping of the wiring board caused by accumulation of warping of each product portion 1 when product portions 1 are continuously provided.

The warping direction is defined next. First, the center of gravity of individual product portion 1 is set as the origin, and the vertical axis and horizontal axis within the area of each product portion 1 are determined. Here, the direction of the horizontal axis is equivalent to a rightward and leftward direction in FIG. 1A, and the direction of the vertical axis is equivalent to an upward and downward direction. Warping in the horizontal-axis direction is calculated by horizontally integrating the displacement of the wiring board in the thickness direction between two points where the horizontal axis crosses both ends of the product portion. If this integrated value is a positive value, it is defined as a convex warping. If this is a negative value, it is defined as a concave warping. Warping in the vertical-axis direction can be calculated in the same way by replacing the horizontal axis with the vertical axis.

The warping direction of the warp-correcting portion can also be calculated with reference to a line connecting two points where extended horizontal axis and vertical axis provided on an adjacent product portion cross the ends of the warp-correcting portion. Warping is calculated by axially integrating the displacement in the thickness direction of the wiring board between these two points. If this value is a positive value, it is defined as a convex warping. If it is a negative value, it is defined as a concave warping. In the exemplary embodiment, the warping direction is a value set relative to the axis direction, and thus positive and negative warping of the product portion may differ between the horizontal axis and vertical axis. The warping directions of the product portion and the warp-correcting portion are compared independently for the horizontal-axis and vertical-axis directions.

As an example of a significant suppressing effect of warp-correcting portion 6, FIG. 1A shows an example that multiple product portions 1 are provided on the wiring board sheet. Even in the case that product portion 1 is provided at one area on the wiring board sheet, the warping can be reduced by providing the warp-correcting portion around the product portion.

Still more, FIG. 1A shows an example of providing warp-correcting portion 6 on an entire area other than product portions 1 but the present invention is not limited to this structure. The warping direction and position of the warp-correcting portion are preferably determined in accordance with a warping trend in the planar vertical axis and horizontal axis of product portion 1. If there is a trend of local warping on the sheet, it is apparent that warp-correcting portion 6 can be provided locally in response to this trend. The same effect is also achievable by providing the warp-correcting portion inside the product portion.

Figure 1B:
FIG. 1B is a sectional view taken along D-D' of the wiring board in accordance with the first exemplary embodiment of the present invention.

FIG. 1B is a sectional view taken along D-D' in FIG. 1A. Since accumulation of slight warping on each product portion 1 is suppressed, warping on the entire sheet can be reduced. Here, a degree of warping is shown as a conceptual figure in comparison with FIG. 5B. Accordingly, it is not the drawing which accurately shows the degree of warping.

Figure 1C:
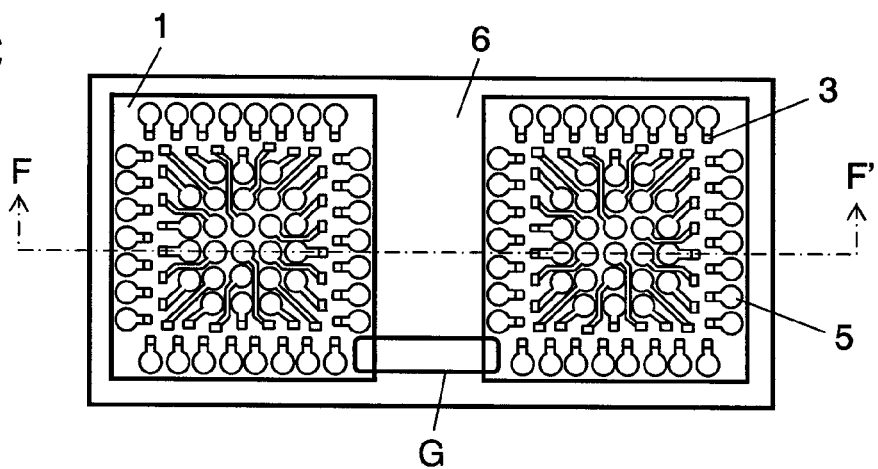
FIG. 1C is an appearance view illustrating a surface of continuous product portions E on the wiring board in accordance with the first exemplary embodiment of the present invention.

FIG. 1C is a magnified view of the surface of adjacent product portions marked part E in FIG. 1A.

In product portion 1, a desired wiring pattern and via for electrically connecting wiring layers are formed so as to achieve a circuit function when an electronic component is mounted. The number of wiring layers varies according to the product. Mobile devices often adopt two to ten layers. The thickness of the electrically insulating base is generally about 100 μm per layer. However, for thin devices, a base with a thickness about 60 μm to 30 μm per layer is used.

Solder resist is formed on product portion 1 as the wiring protection layer so as to protect wiring when mounting the electronic component. The solder resist is formed such that any spreading of the solder from a connection pad to a wiring pattern is prevented when the electronic component is soldered for mounting. Accordingly, the pattern varies in accordance with the mounting layout of electronic components on the wiring board surface of product portion 1.

The solder resist also has a role of preventing disconnection by protecting against scratches and chipping of wiring on the board during handling, in addition to suppression of solder spreading. Accordingly, the solder resist pattern is also designed in consideration of the above-described functions, same as wiring pattern design.

Thermosetting resin such as epoxy resin, acrylate resin, and polyimide resin is used for the wiring protection layer. When non-photosensitive material is used for the wiring protection layer, patterning is feasible, typically by screen printing.

Or, through holes may be patterned on a sheet of wiring protection material in advance, and this sheet is positioned and attached. When a photosensitive material is used as a wiring protection layer, a liquid material is printed or a film material is laminated on the entire face, and then exposed and developed by photolithography for patterning. A photosensitive wiring protection material is generally a negative type, and crosslink of resin advances by irradiating UV beam (ultraviolet rays). General thermosetting resin is heated at around 100° C. to 180° C. for curing the wiring protection layer.

In this exemplary embodiment, an interposer board for bare-chip mounting of the semiconductor using an anisotropic conductive film (ACF) is given as an example of product portion 1. However, the size or type of product portion 1 is not limited. The same effect is achievable for motherboards, module boards, and package boards. In particular, when opening areas in wiring protection layer 2a on the surface (first face) of the board and wiring and wiring protection layer 2 on the rear face (second face) significantly differ, the effect of warp-correcting portion 6 becomes more significant.

For bare-chip mounting, electronic component connection pad 3 is exposed on the surface of product portion 1 for attaching ACF on the semiconductor mounting face, as shown in FIG. 1C. The wiring protection layer is not formed under the semiconductor chip. In other words, wiring protection layer 2a is not formed on the surface of product portion 1, and thus electrically insulating base 7, wiring pattern 5, and connection pad 3 on the wiring board are exposed. The same effect is also achievable when the warp correcting portion is provided inside the product portion.

Figure 1D:
FIG. 1D is a sectional view taken along F-F' of the wiring board in accordance with the first exemplary embodiment of the present invention.
Figure 1E:
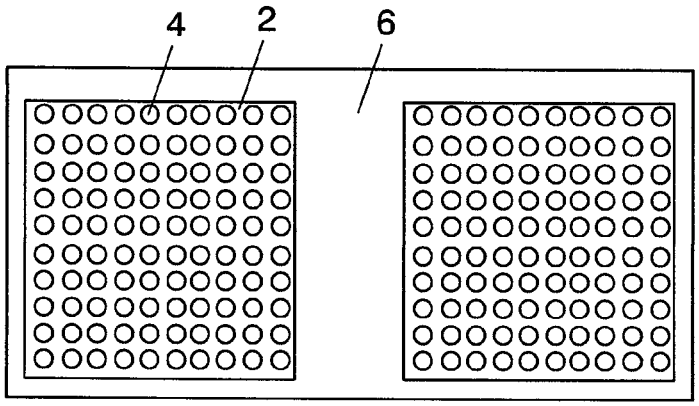
FIG. 1E is an appearance view of a rear face of continuous product portions E on the wiring board in accordance with the first exemplary embodiment of the present invention.

FIG. 1E shows the rear face of product portion 1. Connection pads 4 are formed in a grid on the entire rear face of product portion 1, and solder resist as wiring protection layer 2 is formed on the entire face, except on connection pads 4, for placing solder balls. In other words, connection pads 4 are formed inside openings in wiring protection layer 2. In this type of package boards and module boards such as BGA (Ball Grid Array) and CSP (Chip Size Pacakge), connection pads 4 for solder balls are formed on the rear face of the board for mounting onto the motherboard. Accordingly, the formation area of wiring protection layer 2 enlarges. As a result, a difference in the opening areas of wiring protection layers 2 and 2a on the surface and rear face becomes significant, and thus product portion 1 is more prone to warping.

As described above, unbalanced patterns of wiring protection layers 2 and 2a on the surface and rear face of product portion 1 generate slight warping on product portion 1. Accordingly, warp-correcting portion 6 is warped in a direction opposite to that of product portion 1 in this exemplary embodiment. More specifically, warp-correcting portion 6 is formed such that warping angles of product portion 1 and warp-correcting portion 6 become similar at a boundary. This suppresses accumulation of warping of product portion 1 in the planar direction of the wiring board sheet. As a result, warping of the wiring board sheet can be reduced.

FIG. 1D is a schematic sectional view taken along F-F' in FIG. 1C. Entire warping can be reduced when product portions 1 are continuously disposed, compared to the prior art, by warping warp-correcting portion 6 in an opposite direction to that of product portions 1.

Reduction of warping here means to reduce the warping which causes a failure in the mounting process due to a warped board. Environmental conditions under which warping occurs, such as temperature and humidity; board size; and board form are determined individually for each mounting method.

Figure 2A:
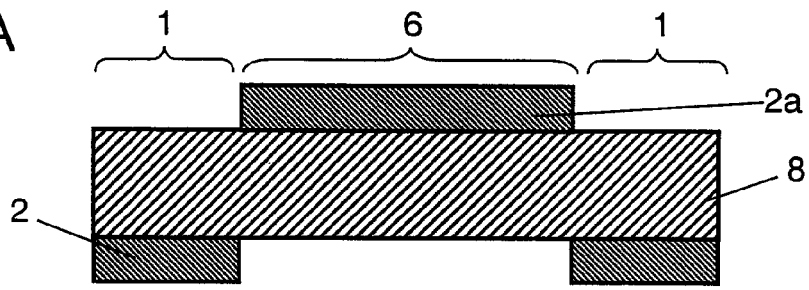
FIG. 2A is a sectional view of an example of part G of the wiring board in accordance with the first exemplary embodiment of the present invention.

Next, a structure of warp-correcting portion 6 is described with reference to FIGS. 2A and 2B as an example. FIGS. 2 show a cross-sectional structure of part G in FIG. 1C. FIG. 2A is an example of the cross-sectional structure of warp-correcting portion 6, and illustrates an example that product portion 1 is warped in a convex manner on the surface shown in FIG. 1C. Warp-correcting portion 6 is warped by making wiring protection layer 2 and 2a generate a bending moment on the surface and rear face. Drying and curing shrinkage of wiring protection layer 2 and 2a, thermal expansion coefficient of material, and material rigidity are used as a means for generating the bending moment, but any means is applicable as long as the bending moment is generated.

In FIG. 1C, wiring protection layer 2a is preferably formed just on one side of wiring board 8 as warp-correcting portion 6. Warp-correcting portion in FIG. 2A warps in a downward convex manner by making wiring protection layer 2a generate the bending moment. Formation of wiring protection layer 2a only on one face of warp-correcting portion 6 generates further larger bending moment in the warp-correcting portion. The warping angle can thus be matched at the boundary to product portion 1 even with narrow warp-correcting portion 6.

Figure 2B:
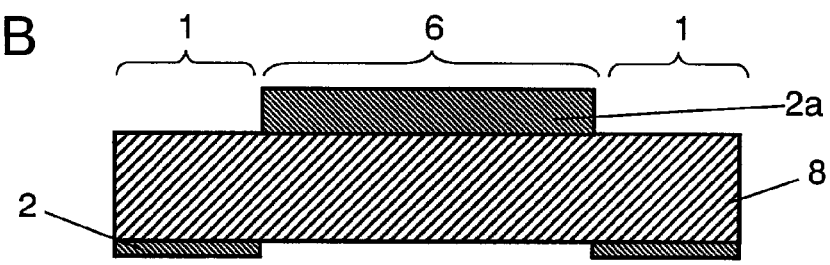
FIG. 2B is a sectional view of an example of part G of the wiring board in accordance with the first exemplary embodiment of the present invention.

As shown in FIG. 2B, wiring protection layer 2a formed on warp-correcting portion 6 is preferably formed thicker compared to that of wiring protection layer 2 formed on the other face so as to generate a further larger bending moment on warp-correcting portion 6. Thicker wiring protection layer 2a where a shrinkage stress is generated applies a further larger bending moment to wiring board 8, and thus causes further larger warping in a narrow width on warp-correcting portion 6.

A larger bending moment can also be generated by setting a higher curing rate for wiring protection layer 2a formed on warp-correcting portion 6 than that of the other wiring protection layer 2. More specifically, wiring protection layer 2a is heated by a lamp heater or irradiated with UV rays by an UV lamp from one side so as to increase the curing rate of wiring protection layer 2a only on one side. It is further preferable to use UV-curable resin as wiring protection layer 2a and irradiate UV rays on one face because the curing state can be accurately controlled by an UV irradiance level.

It is also preferable to warp warp-correcting portion 6 in advance in a direction opposite to that of product portion 1 before forming wiring protection layer 2a on warp-correcting portion 6. In the manufacturing process of wiring board 8, a copper foil, which is a wiring material, and an electrically insulating base are thermally pressed for attachment. At this point, an internal stress remains on the wiring board after pressing due to a difference in thermal expansion of the wiring material and a thermal expansion of the electrically insulating base. In other words, position of the wiring pattern on the wiring board in the warp-correcting portion is made asymmetrically in the thickness direction so as to warp the warp-correcting portion in a predetermined direction before forming the wiring protection layer. This assists warp correction by means of the wiring protection layer.

Warping of product portion 1 can also be corrected by warping warp-correction portion 6 to an opposite direction to product portion 1 only by means of the electrically insulating base and the wiring pattern. FIG. 2A shows an example of forming wiring protection layer 2a on the entire area of warp-correcting portion 6. However, wiring protection layer 2a may be patterned for adjusting the warping angle at the boundary with product portion 1. Even if wiring protection layers 2 and 2a are patterned on the surface and rear face, the same effect is achievable if the openings in wiring protection layers 2 and 2a are unbalanced between the surface and rear face of the wiring board.

It is further preferable not to form the wiring pattern on an inner layer and outer layer of wiring board 8 in warp-correcting portion 6. The elastic modulus of the copper foil, which is generally used for the wiring pattern, is 47 Gpa for 35-μm thick copper foil. This is large compared to a material for the electrically insulating base. Accordingly, the copper foil formed on the inner and outer layers of the wiring board suppresses warping of the wiring board. It is preferable to design such that the copper foil remains as much as possible in the inner and outer layers of product portion 1 so as to reduce warping of the product portion. However, in warp-correction portion 6, no formation of the wiring pattern in the inner and outer layers of the wiring board is better for achieving a large warping angle in a narrower width. The same effect is also achievable when the warp-correcting portion is provided on product portion 1.

As an electrically insulating base for the wiring board, a composite material of glass fiber and thermosetting resin, a composite material of organic resin fiber and thermosetting resin, or a composite material of heat-resisting film and adhesive can be used.

As a composite material of glass fiber and thermosetting resin, a material in which thermosetting resin such as epoxy resin, PPE (modified polyphenylene ether) resin, PPO (polyphenylene oxide) resin or BT (bismaleimide-triazine) resin is impregnated into woven glass fabric can be used. The use of the warp-correcting portion of the present invention enables suppression of warping of the wiring board sheet even for a wiring board made of a composite material of glass fiber and thermosetting resin which is highly rigid and less warped by its own weight.

As an organic resin fiber, a material in which epoxy resin, PPE resin, PPO resin or phenol resin is impregnated into a nonwoven fabric such as aramid fiber, liquid crystal polymer fiber, PTFE (polytetrafluoroethylene) fiber, and Teflon (registered trademark) fiber can be used. The use of such organic resin fibers as a reinforcement material enables reduction of the elastic modulus of the electrically insulating base, even for a rigid wiring board. This enables the warp-correcting portion to occupy a narrower width, achieving even denser placement of product portions.

As a heat-resisting film, a thermosetting resin film such as epoxy, a thermosetting resin film in which inorganic filler is dispersed, and a thermoplastic film base such as fluorocarbon resin, polyimide resin, and liquid crystal polymer can be used. As an adhesive layer, a material mainly containing epoxy resin, epoxyacrylate resin, or polyimide resin can be used. The use of the warp-correcting portion of the present invention enables effective reduction of warping, even for a flexible board in which heat-resisting film bases are multi-layered using adhesive and thus its rigidity is increased.

With respect to a material for the electrically insulating base, the composition ratio of the above composite materials is preferably adjusted to set the elastic modulus to not greater than 10 GPa so as to warp warp-correcting portion 6 in a narrow width, and thus gain more design flexibility in adjusting the warping angle.

The electrically insulating base is not limited to the above materials. The same effect of reducing warping over the entire sheet is achieved by forming the warp-correcting portion in an area other than the product portion, even for build-up boards and flexible boards.

Since the board rigidity decreases in a board that is 0.3 mm thick or thinner, the warp-correcting portion of the present invention can effectively demonstrate its correcting effects.

Second Exemplary Embodiment

Figure 3A:
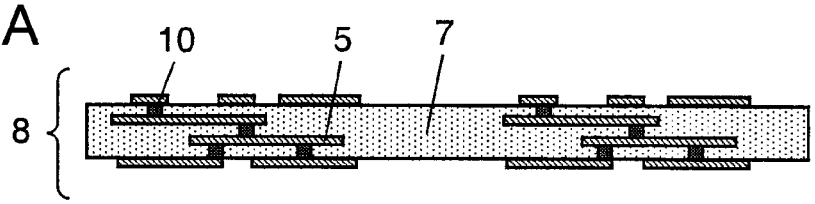
FIG. 3A is a process sectional view illustrating each major step of a manufacturing method of the wiring board in accordance with a second exemplary embodiment of the present invention.
Figure 3B:
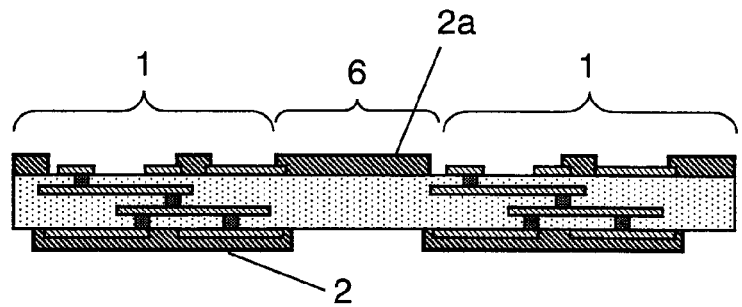
FIG. 3B is a process sectional view illustrating each major step of the manufacturing method of the wiring board in accordance with the second exemplary embodiment of the present invention.
Figure 3C:
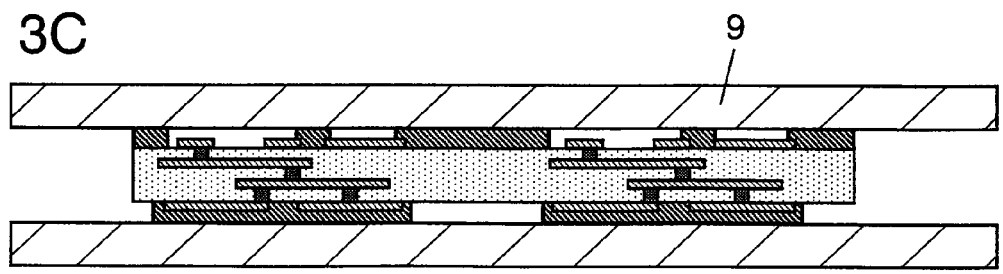
FIG. 3C is a process sectional view illustrating each major step of the manufacturing method of the wiring board in accordance with the second exemplary embodiment of the present invention.

FIGS. 3A to 3C show major manufacturing steps of wiring board 8 of the present invention. FIG. 3A shows wiring board 8 configured with electrically insulating base 7, wiring pattern 5, and via 10. Aforementioned materials can be used for electrically insulating base 7. The drawings show the case of vias with IVH (inner via hole) structure in all layers, a so-called any-layer IVH. However, the present invention is not limited to this structure. A through-hole via structure and build-up board structure are also applicable. Via 10 is made of conductive paste filled in a hole. The use of incompressible base such as nonwoven aramid fabric base and glass epoxy base for electrically insulating base 7 achieves wiring board 8 with even denser structure.

Since nonwoven aramid board has lower elastic modulus and thus low board rigidity, compared to that of the glass epoxy board, the warp-correcting portion of the present invention can further effectively correct warping.

Next, wiring protection layer 2a is formed as warp-correcting portion 6 on one surface of wiring board 8, and solder resist and so on are formed as wiring protection layer 2 on the other surface of wiring board 8, as shown in FIG. 3B. Details of materials for warp-correcting portion 6 and wiring protection layer 2 are already described and thus the description is omitted here. Warp-correcting portion 6 and wiring protection layer 2 shown in FIG. 3B are formed in product portion 1 based on a predetermined design pattern that satisfies product requirements, as described in advance. In warp-correcting portion 6, wiring protection layer 2a has a design pattern that achieves a predetermined warping angle at the boundary with product portion 1. In this step, warp-correcting portion 6 and wiring protection layer 2 are dried and cured if it is made of thermosetting resin. In this state, bending due to handling in the step of wiring board 8 and board deformation due to a residual stress of the electrically insulating base occur in addition to the warping of wiring board 8 by shrinkage of wiring protection layers 2 and 2a.

Next, as shown in FIG. 3C, wiring board 8 is held with flat boards 9 from the surface and rear face so as to be heated at the glass transition temperature of electrically insulating base 7 and wiring protection layers 2 and 2a or higher. Heating at the temperature not less than the glass transition temperature of electrically insulating board 7 and wiring protection layer 2 and 2a reduces an internal stress in the electrically insulating base and wiring protection layers 2 and 2a. Accordingly, the warping of wiring board 8 can be corrected by eliminating the residual stress applied during manufacturing steps.

Also in this warp-correcting step, the electrically insulating base is preferably cured again in a state that the warping is corrected by flat boards 9 so that the curing rate can be increased. Since the curing rate is increased at the temperature not less than the glass transition temperature, plastic deformation of the electrically insulating base is accelerated. As a result, bending and warping mechanically applied during the step of manufacturing the electrically insulating base which has higher rigidity than that of wiring protection layers 2 and 2a can be effectively corrected.

In this warp-correcting step, flat boards 9 deform due to uneven heating temperature. Accordingly, it is necessary to suppress deformation by typically using a holder. In this regard, flat boards 9 are preferably pressurized from both sides at between 1 and 10 kgf/cm$^2$.

SUS sheet or glass sheet can be used as a material for flat boards 9. If a material which transmits UV rays, such as a glass sheet, is used, curing by UV-ray irradiation can be applied through the flat boards. If a photosensitive material is patterned using photolithography as wiring protection layers 2 and 2a, warping can be further effectively corrected by acceleration of UV-curing.

UV rays are preferably irradiated on one face at a time of wiring board 8. The curing rate of photosensitive wiring protection layers 2 and 2a can be made different between the surface and rear face, using a simple method. This allows the control of a warping degree in the warp-correcting portion independently on the surface and rear face.

FIG. 3C shows a preferable example of using flat boards 9 as a warp-correcting means. However, the warp-correcting means is not limited. The same warp-correcting effect is achievable by heating at a temperature not less than the glass transition temperature of electrically insulating base 7 and wiring protection layers 2 and 2a even when disclosed conventional methods of holding the wiring board are used.

Third Exemplary Embodiment

Figure 4A:
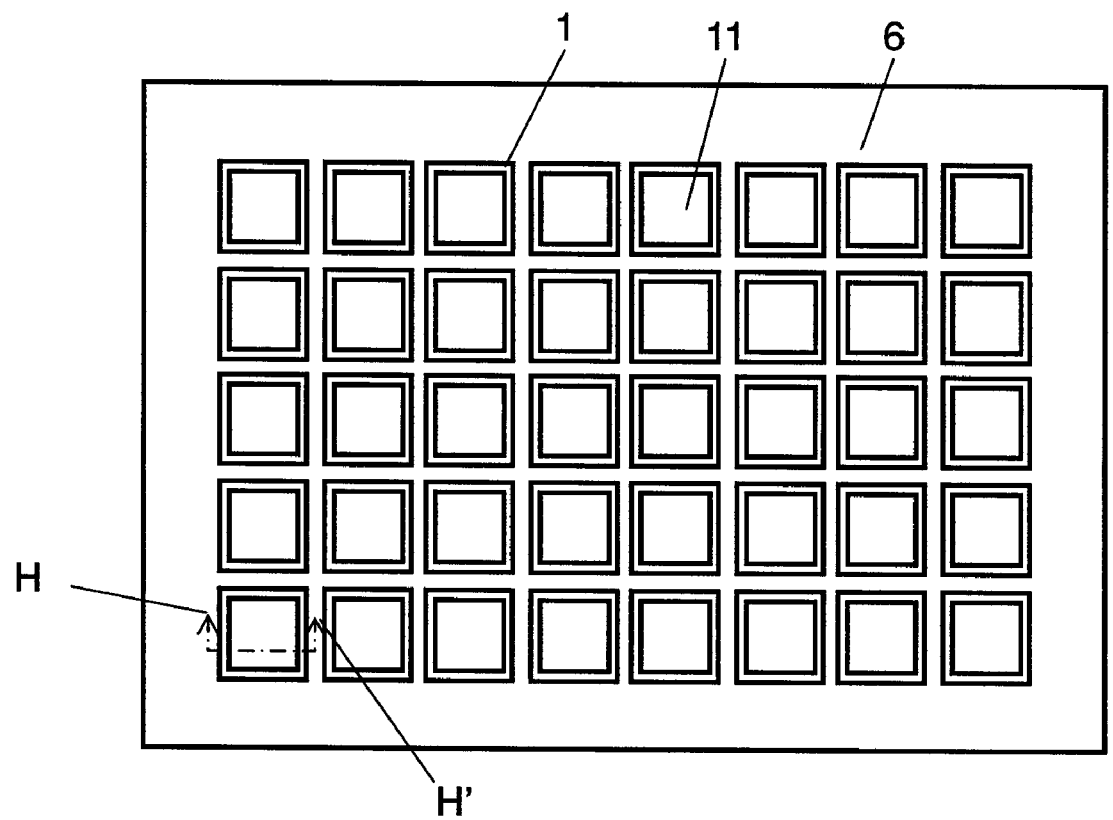
FIG. 4A is an appearance view of a semiconductor device in accordance with a third exemplary embodiment of the present invention.

FIG. 4 show a semiconductor device on which a semiconductor is bare-chip mounted as an example of a component mounted on a wiring board of the present invention. FIG. 4A is a wiring board sheet of the present invention, illustrating, as an example, a four-layer board with the any-layer IVH structure. However, the structure of wiring board is not limited. Warping of the wiring board sheet can be reduced by forming warp-correcting portion 6. Warp-correcting portion 6 can be disposed at predetermined positions in response to the warping state of product portion 1, as already described.

Figure 4B:
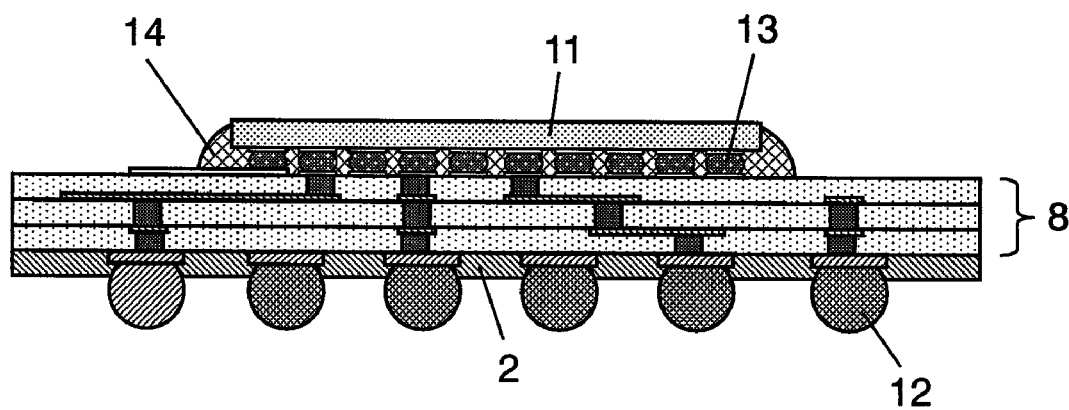
FIG. 4B is a sectional view taken along H-H' of the semiconductor device in accordance with the third exemplary embodiment of the present invention.

Semiconductor chip 11 is mounted as an electronic component on product portion 1 of this wiring board sheet. FIG. 4B is a sectional view taken along H-H' in FIG. 4A, and illustrates the mounted state of semiconductor chip 11. Wiring protection layer 2 is formed entirely over a face different from the face where the semiconductor chip is mounted on wiring board 8, and then solder ball 12 is provided. Semiconductor chip 11 is electrically connected to wiring board 8 via connecting portion 13, and is firmly fixed to wiring board 8 by sealing resin 14. When semiconductor chip 11 is mounted facing down on the sheet of wiring board 8, as described above, reduction of warping of wiring board 8 is important for ensuring mountability. If wiring board 8 is significantly warped, positioning accuracy reduces due to the warped wiring board when the semiconductor chip is positioned and fixed on the wiring board, in addition to a failure in transport such as loading and unloading of wiring board 8. As a result, mounting reliability decreases. Accordingly, if the semiconductor is mounted on the sheet of wiring board of the present invention, whose warping is suppressed, transport failures and positional deviation in mounting the semiconductor due to the warped wiring board can be reduced. This improves the production yield of semiconductor devices, and also improves primary mounting reliability of semiconductor in the semiconductor device.

In the third exemplary embodiment, FIG. 4 show an example of bare-chip mounting using connecting portion 13 such as a metal bump and solder bump for face-down mounting. However, the same effect of improving mountability of semiconductors is achievable by reducing warping of the wiring board even in the cases of mounting by wire-bonding and when wafer-level CSP, in which a stress-reducing layer is provided on the chip surface, is used as a semiconductor chip In this exemplary embodiment, an example of mounting the semiconductor chip as an electronic component is described. However, the electronic component is not limited to the semiconductor chip. The same effect of improving mountability can be achieved by reducing warping of the wiring board when chip components and electronic component packages such as chip resistors, chip inductors, chip capacitors, temperature-compensating crystal oscillators (TCXO), and surface acoustic wave (SAW) filters are mounted to form module boards.

Fourth Exemplary Embodiment

Figure 5:
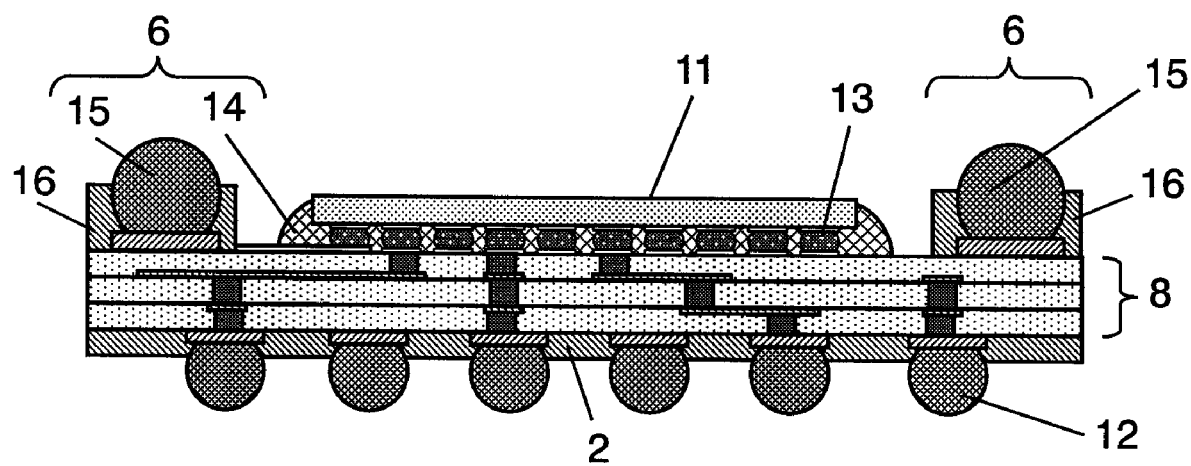
FIG. 5 is a sectional view of the semiconductor device in accordance with a fourth exemplary embodiment of the present invention.
Figure 6A:
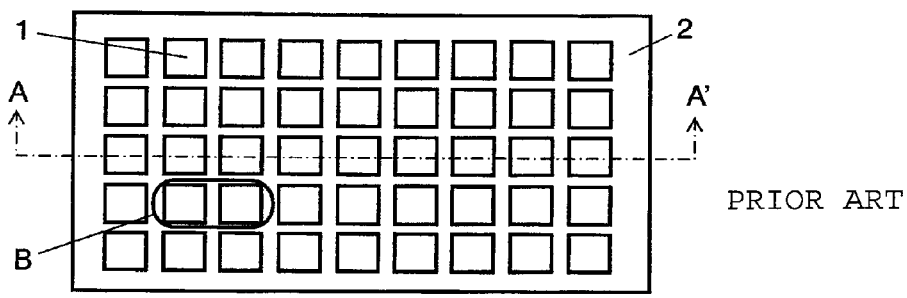
FIG. 6A is an appearance view of a conventional wiring board.
Figure 6B:
FIG. 6B is a sectional view taken along A-A' of the conventional wiring board.
Figure 6C:
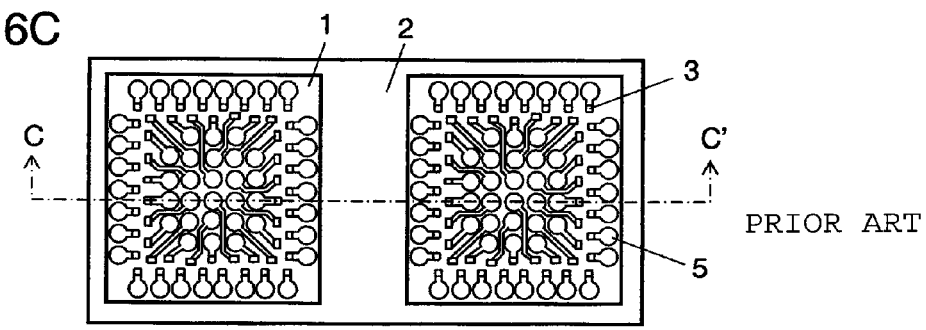
FIG. 6C is an appearance view illustrating a surface of continuous product portions B on the conventional wiring board.
Figure 6D:
FIG. 6D is a sectional view taken along C-C' of the conventional wiring board.
Figure 6E:
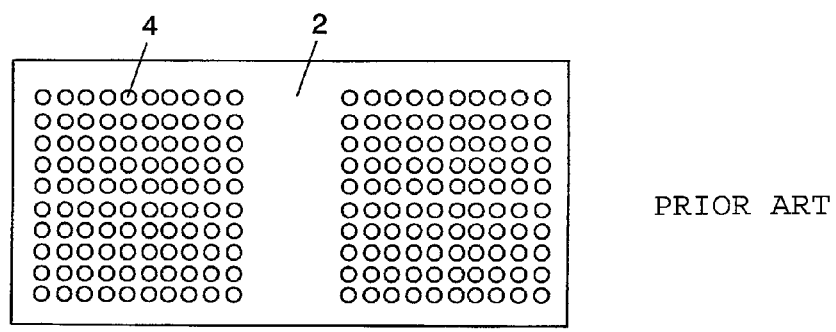
FIG. 6E is an appearance view illustrating a rear face of continuous product portions B on the conventional wiring board.

FIG. 5 is a sectional view of a semiconductor device in which a semiconductor is bare-chip mounted, as an example of mounting a component on a wiring board in the fourth exemplary embodiment of the present invention. A point which differs from an example described in the third exemplary embodiment is that warp-correcting portion 6 is provided on product portion 1. Points already described in the third exemplary embodiment are omitted here to avoid duplicate description.

As shown in FIG. 5, semiconductor chip 11 is mounted as an electronic component on wiring board 8. The board same as in the third exemplary embodiment is used as wiring board 8. A number of wiring patterns per unit area can be increased by the use of a board with the any-layer IVH structure, as already described in the exemplary embodiments.

Warp-correcting portion 6 is provided on product portion 1 in an area other than a mounting area of semiconductor chip 11. More specifically, as shown in FIG. 5, a periphery of product portion 1 is warp-correcting portion 6. This warp-correcting portion 6 can correct warping of the semiconductor device after the semiconductor chip is mounted. In a step of mounting semiconductor chip 11 on the wiring board, the heat is generally applied for curing resin or melting solder. At this point, semiconductor chip 11 is fixed to the wiring board at a high temperature, and the entire semiconductor device is warped after cooling, due to a difference in thermal expansion coefficient of semiconductor chip 11 and the wiring board. Warp-correcting portion 6 corrects warping occurred in this way so as to reduce warping over the entire semiconductor device. It is thus further preferable to provide warp-correcting portion 6 on an area prone to warping outside the area for mounting semiconductor chip 11 in the area of product portion 1.

As shown in FIG. 5, solder ball 15 may further be provided on the mounting face of semiconductor chip 11 on wiring board 8. Since the solder ball is provided on both faces of the semiconductor device, another semiconductor device can be laminated on the chip face of the semiconductor device.

In case of wiring board 8 with solder ball 15, warping of wiring board 8 needs to be reduced at a high temperature at which solder ball 15 is melted, so as to increase the positional accuracy of solder ball 15. For this purpose, warp-correcting portion 6 of the present invention reduces warping of the semiconductor device at a high temperature for achieving stable solder-ball connection. Accordingly, connection reliability between laminated semiconductor devices can be ensured.

For wiring board 8, it is preferable to use a material with low elastic modulus so as to increase warp-controllability of warp-correcting portion 6, and thus an nonwoven aramid fabric base is preferable as a rigid wiring board. In addition, by combining materials with different elastic modulus and thermal expansion coefficient and by changing thickness of wiring protection layer 16 and wiring protection layer 2, a warp-controllable range can be broadened. On the other hand, to reduce variations in warping due to variation in thickness of the wiring protection layer, a material with low elastic modulus is preferably used, and thus the tensile elastic modulus of 3.5 GPa or lower is preferable.

In FIG. 5, wiring protection layer 16 at the side of semiconductor chip 11 is made thicker than the other face as warp-correcting portion 6, and is configured to generate a bending moment so as to warp the warp-correcting portion in a convex manner on the side of semiconductor chip 11. However, a direction of bending moment in warp-correcting portion 6 is not limited to this direction. If a direction required for correcting warping is opposite, depending on wiring design of wiring board 8 or a mounting method of semiconductor chip 11, it is apparent that the same effect is achievable by generating the bending moment so as to warp the warp-correcting portion in a concave manner on the side of semiconductor chip 11.

With respect to a method of setting different thickness for wiring protection layer 16 and wiring protection layer 2 in warp-correcting portion 6, the wiring protection layer with different thickness may be formed on each face in advance, as shown in FIG. 5. Or, only the warp-correcting portion may be thickened by forming the wiring protection layer twice on the same face. More specifically, the wiring protection layer can be formed only on the warp-correcting portion for the second time by using a means for forming the wiring protection layer such as screen printing.

The structure of this warp-correcting portion 6 is not limited. It is apparent that the same effect is achievable with the structures of warp-correcting portion 6 already described in the previous exemplary embodiments.

FIG. 5 shows an example of face-down mounting of semiconductor chip 11. However, the semiconductor mounting method is not limited to this method. The effect of the warp-correcting portion can be demonstrated regardless of semiconductor mounting methods.

Mounting of the semiconductor chip is given as an example of electronic component in this exemplary embodiment, and thus the electronic component is not limited to the semiconductor chip. The same effect of improving mountability can be achieved by reducing warping of the wiring board when chip components and electronic component packages such as chip resistors, chip inductors, chip capacitors, TCXOs, and SAW filters are mounted to form module boards.

INDUSTRIAL APPLICABILITY

The wiring board of the present invention and the method of manufacturing the wiring board of the present invention suppress the accumulation of warping of the board of each product portion on a large sheet by forming the warp-correcting portion on an area other than the product portion on the wiring board, even when multiple product portions are provided on the wiring board. The present invention can thus offer a wiring board with slight warping as an entire sheet. In other words, the present invention is effective for large and thin wiring boards.

The invention claimed is:

1. A wiring board having an electrically insulating base, comprising:
   a plurality of product portions having a wiring pattern formed on the electrically insulating base; and
   a warp-correcting portion provided on an area other than the product portions;
   wherein the warp-correcting portion is formed only on one face of the electrically insulating base and warped in a direction opposite to a warping direction of the product portions.

2. The wiring board of claim 1, wherein
   the wiring board has a first face and a second face; and
   the product portions include:
      a wiring protection layer on the second face, the wiring protection layer having a plurality of openings, and a connection pad being formed inside the plurality of openings; and
      a wiring protection layer as a warp-correcting portion on the first face, the wiring protection layer having an opening whose opening area being larger than a total area of the plurality of openings in the second face.

3. The wiring board of claim 1, wherein the product portions have a wiring protection layer only on one face of the wiring board, the wiring protection layer being formed around a connection pad.

4. The wiring board of claim 1, wherein the wiring board has the plurality of product portions, and the warp-correcting portion is provided between the product portions.

5. The wiring board of claim 1, wherein at least a part of the warp-correcting portion is configured only on one face of the wiring board as a wiring protection layer.

6. The wiring board of claim 1, wherein at least a part of the warp-correcting portion has no wiring pattern on an inner layer and an outer layer of the wiring board.

7. The wiring board of claim 1, wherein
   the wiring board has a first face and a second face, the first face having a wiring protection layer as the warp-correcting portion and the second face having a protection layer on the product portions; and
   a thickness of the wiring protection layer as the warp-correcting portion on the first face is different from a thickness of the wiring protection layer on the second face.

8. The wiring board of claim 1, wherein
   the wiring board has a first face and a second face, the first face having a wiring protection layer as the warp-correcting portion and the second face having a protection layer on the product portions;
   the wiring protection layer as the warp-correcting portion on the first face and the wiring protection layer on the second face are made of curable resin; and
   a curing rate of the wiring protection layer as the warp-correcting portion on the first face is different from a curing rate of the wiring protection layer on the second face.

9. The wiring board of claim 1, wherein the warp-correcting portion only includes the electrically insulating base and the wiring pattern, the warp-correcting portion being warped in a direction opposite to that of the product portions.

10. The wiring board of claim 1, wherein the electrically insulating base is made of a composite material of glass fiber and thermoset resin.

11. The wiring board of claim 1, wherein the electrically insulating base is made of a composite material of organic resin fiber and thermosetting resin.

12. The wiring board of claim 1, wherein the electrically insulating base is made of a composite material of a heat-resisting film and adhesive.

13. The wiring board of claim 1, wherein an elastic modulus of the electrically insulating base is not greater than 10 GPa.

14. A wiring board comprising:
   a plurality of product portions configured with a wiring pattern and a wiring protection layer formed on an electrically insulating base;
   an area other than the product portions provided on the electrically insulating base; and
   a warp-correcting portion formed only on one face of the electrically insulating base;
   wherein the product portions include a mounting area and an area not for mounting, the warp-correcting portion is provided on one of the area other than the product portions and the area not for mounting on the product portions including the area other than the product portions, and the wiring protection layer is formed on one of entire and part of a face backside of a face where the warp-correcting portion is formed, and
   wherein the warp-correcting portion is warped in a direction opposite to a warping direction of the product portions.

15. The wiring board of claim 14, wherein
   the wiring board has a first face and a second face, the first face having a wiring protection layer as the warp-correcting portion and the second face having a protection layer on the product portions;
   the wiring protection layer as the warp-correcting portion on the first face and the wiring protection layer on the second face are made of curable resin; and
   a curing rate of the wiring protection layer as the warp-correcting portion on the first face is different from a curing rate of the wiring protection layer on the second face.

* * * * *

UNITED STATES PATENT AND TRADEMARK OFFICE
CERTIFICATE OF CORRECTION

| | |
|---|---|
| PATENT NO. | : 8,071,881 B2 |
| APPLICATION NO. | : 11/719313 |
| DATED | : December 6, 2011 |
| INVENTOR(S) | : Hideki Higashitani |

It is certified that error appears in the above-identified patent and that said Letters Patent is hereby corrected as shown below:

In column 10, line 23, after the word "pattern" should begin a new paragraph.

Signed and Sealed this
Eighth Day of May, 2012

David J. Kappos
*Director of the United States Patent and Trademark Office*